United States Patent [19]

Hickman et al.

[11] 4,427,902

[45] Jan. 24, 1984

[54] OPTIMUM TRANSISTOR DRIVE CIRCUIT WITH OVER LOAD COMPENSATION

[75] Inventors: Mark Hickman, Westboro, Mass.; Michael M. Brown, Kingston, N.H.

[73] Assignee: Vee Arc Corporation, Westboro, Mass.

[21] Appl. No.: 359,037

[22] Filed: Mar. 17, 1982

[51] Int. Cl.³ .................... H03K 3/26; H03K 23/22
[52] U.S. Cl. .................... 307/270; 307/300; 307/315; 307/359; 363/56
[58] Field of Search .......... 307/270, 359, 315, 300, 307/549; 363/56; 361/23, 28

[56] References Cited

U.S. PATENT DOCUMENTS

| | | | |
|---|---|---|---|
| 4,201,928 | 5/1980 | Koetsch | 307/300 |
| 4,318,011 | 3/1982 | Zels | 307/255 |
| 4,399,500 | 8/1983 | Clarke et al. | 307/270 |

*Primary Examiner*—Stanley D. Miller
*Assistant Examiner*—B. P. Davis
*Attorney, Agent, or Firm*—Wolf, Greenfield & Sacks

[57] ABSTRACT

A circuit for driving a power transistor that forms a part of an inverter circuit used in motor control in which the circuit is switched at high voltages. The motor drive circuit isolates and amplifies a control signal so as to operate the power switching transistors. The base drive circuit employs two characteristics of power transistors to derive maximum protection and maximum performance simultaneously. This control is accomplished by sensing both the collector-to-emitter voltage of the power transistor as well as the base-to-emitter voltage thereof.

11 Claims, 4 Drawing Figures

OPTIMUM TRANSISTOR DRIVE CIRCUIT WITH OVER LOAD COMPENSATION

BACKGROUND OF THE INVENTION

The present invention relates in general to a motor drive technique, and pertains, more particularly to a power transistor drive circuit usually used in an inverter type configuration in a multiphase motor drive. The base drive circuit of the invention operates to derive maximum power transistor protection, at the same time permitting maximum performance. Optimum load drive is possible but is accomplished without fear of component overload.

In an inverter drive for an AC motor there are typically provided power transistors associated with each phase. The output power transistor is switched on a selective basis from a high voltage non-conduction state, to a low voltage conduction state in which there is a large collector current. This switching from a high voltage to a low voltage state occurs as rapidly as possible. During this switching action there is generally a much larger base current provided during the initial portion of the conduction cycle than during the remainder of the cycle. Conditions may exist wherein the load becomes shorted in which case the base drive causes excessive collector current to flow at the same time that there is a full supply voltage across the transistor. Under such conditions the collector current is usually sensed and is limited with the transistor then being turned off, preferably within several microseconds.

Accordingly, it is an object of the present invention to provide an improved transistor drive circuit, referred to herein as a base drive circuit, for controlling the operation of a power switching transistor. The base drive circuit isolates and amplifies an input control signal to a sufficient level to operate the power switching transistor.

Another object of the present invention is to provide an improved base drive circuit that also provides for protection of the power transistor so that the transistor is not destroyed during operation.

Still another object of the present invention is to provide a base drive circuit that senses not one but preferably two parameters of the power transistor to derive maximum protection and allow maximum performance substantially simultaneously.

SUMMARY OF THE INVENTION

To accomplish the foregoing and other object of this invention there is provided a base drive circuit which is adapted to isolate and amplify a control signal for driving a power switching transistor or power switching Darlington transistor. The power transistor is typically biased and is controlled to switch high voltages associated with AC motor drive. The power transistor typically includes an input or base electrode and a pair of output electrodes comprising emitter and collector electrodes. The circuit of the invention comprises input circuit means for receiving an input control signal that is adapted to switch the power transistor, and control transistor means coupled from the input circuit means having drive and non-drive states and having its output coupled to the base of the power transistor. The base drive circuit utilizes essentially two characteristics of the power transistor or power Darlington transistor to derive maximum protection and allow maximum performance simultaneously. To provide this control there is provided a first means which is responsive to the magnitude of the collector-to-emitter voltage of the power transistor so that when this succeeds a predetermined threshold the drive current is decreased to the power transistor. This first means is adapted for operation during the normal conduction cycle. In the event of an overload or short circuit condition then there is provided a second means responsive to the magnitude of the base to emitter voltage of the power transistor so that when this exceeds a predetermined threshold there is also a decrease in the drive current to the power transistor. Also, in the event of an overload or short circuit condition, there is a means provided for turning off the base drive, independent of the input command, after a delay of say several microseconds should the overload continue throughout the delay period. The base drive remains in its off state until the input again transitions from an off command to an on command.

BRIEF DESCRIPTION OF THE DRAWING

Numerous other objects, features and advantages of the invention will become apparent upon a reading of the following detailed description taken in conjunction with the accompanying drawing, in which.

DETAILED DESCRIPTION OF THE DRAWINGS

The present invention relates primarily to a circuit for driving power transistors arranged in a motor drive configuration typically referred to as an inverter. This drive circuit, referred to herein as a base drive circuit is primarily shown in FIG. 3. However, FIGS. 1 and 2 illustrate the power drive transistors and associated circuitry used in providing the primary operating power for the transistor inverter circuit.

Figure 1:
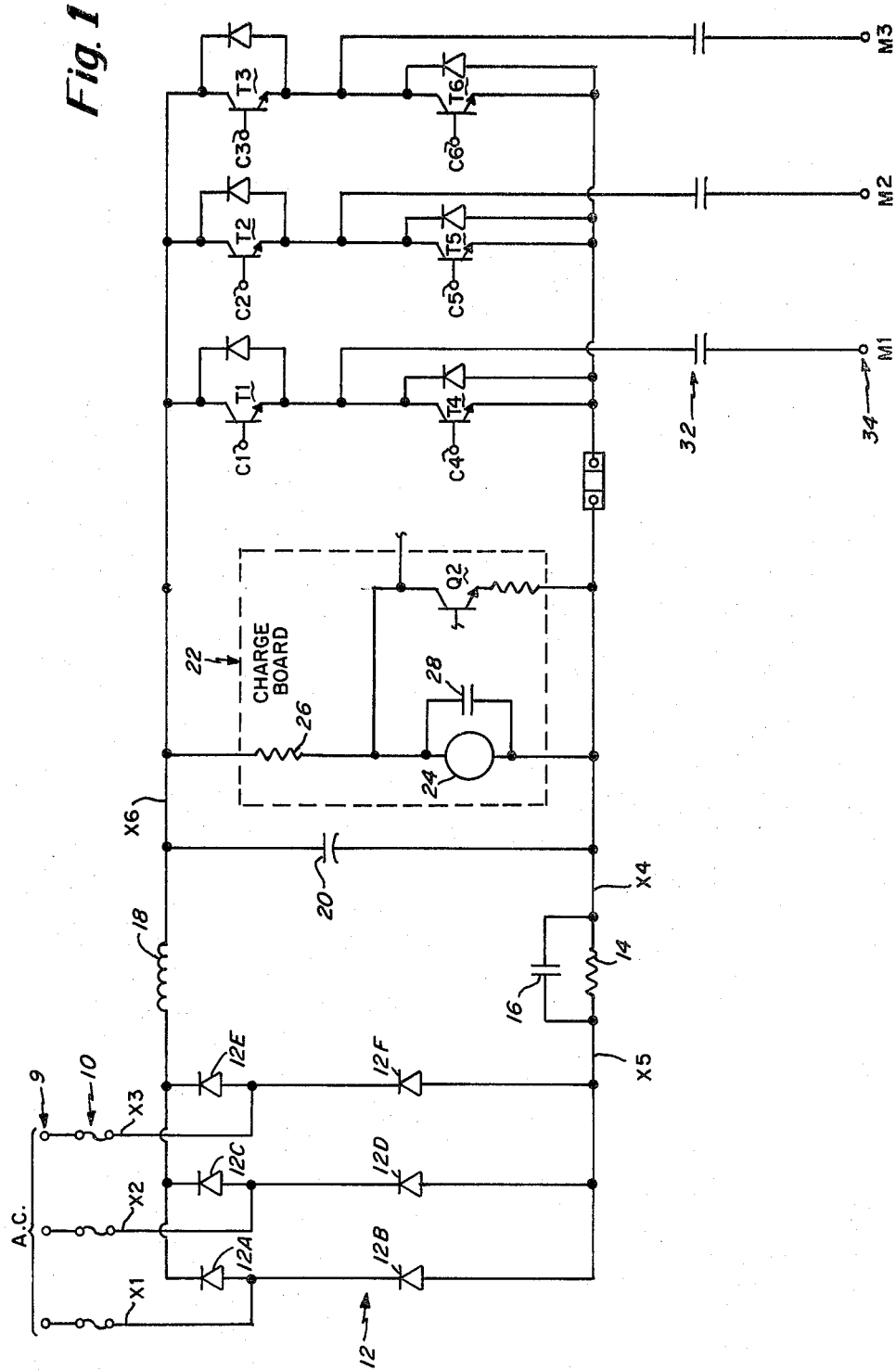
FIG. 1 is a circuit diagram illustrating a part of the motor control circuit showing in particular the power drive transistors as applied in a three phase motor application.
Figure 2:
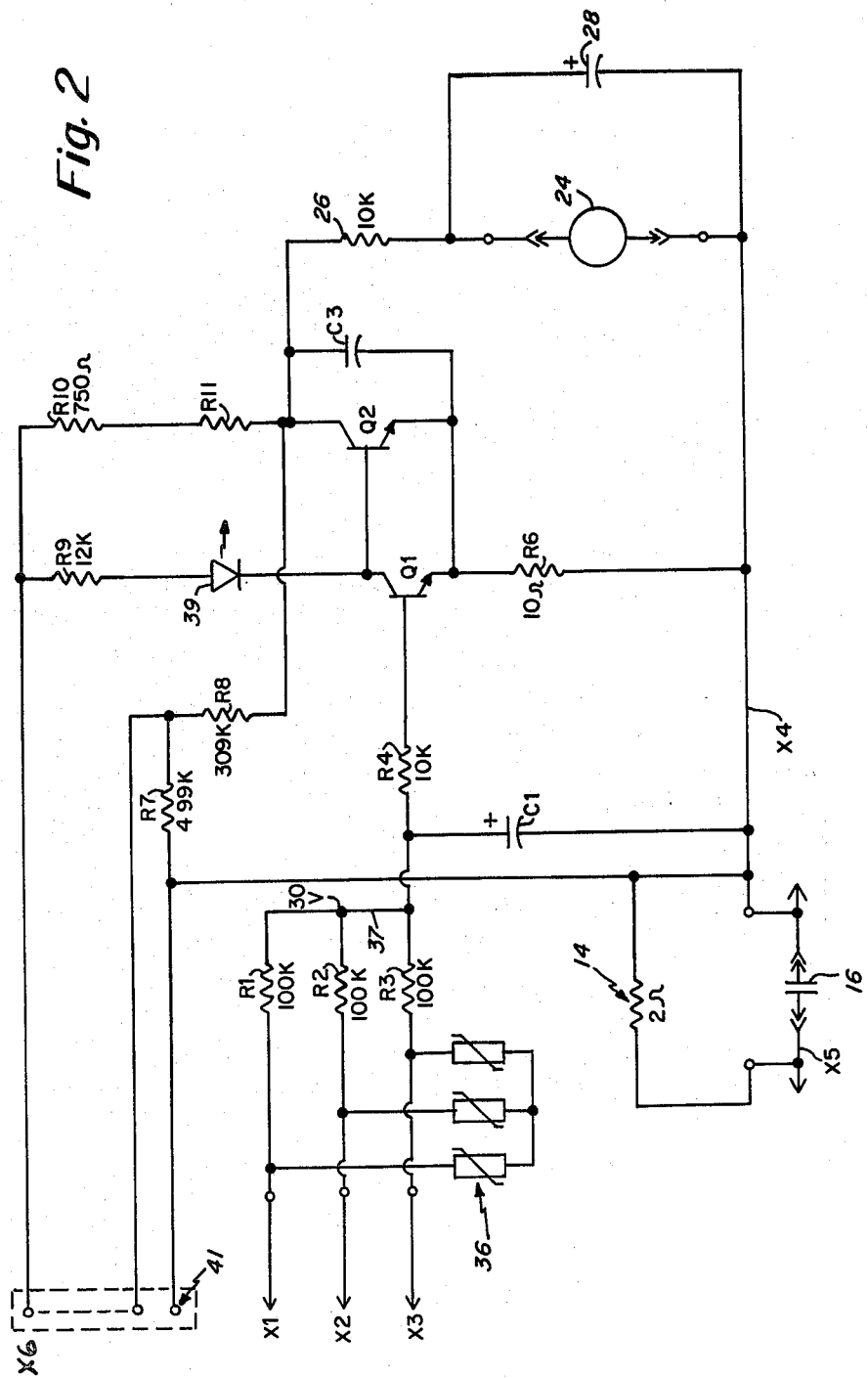
FIG. 2 is a circuit diagram of additional control circuitry associated with the circuit diagram of FIG. 1.

FIG. 1 shows the conventional AC input at terminals 9 coupling by way of fuses 10 to AC input lines X1, X2 and X3. These lines couple to a diode bridge 12 which is comprised of diodes connected in pairs including a first pair 12A, 12B; a second pair 12C, 12D; and a third pair 12E, 12F. The line X1 couples to the junction between diodes 12A and 12B; the line X2 couples to the junction between diodes 12C and 12D; and the line X3 couples to the junction between diodes 12E and 12F.

In addition to lines X1, X2 and X3 there are also shown in FIG. 1 lines X4, X5 and X6. Lines X4 and X5 are across a two ohm resistor 14 which has a contact 16 in parallel therewith. The resistor 14 and contact 16 are also described in FIG. 2 referred to hereinafter. In addition to the bridge 12 coupling to the resistor 14 and contact 16, the other side thereof couples to a series inductor 18 which couples to the high voltage line X6. The other high voltage line is line X4. Between these lines is also disposed the primary filter capacitor 20.

FIG. 1 also shows the charge board 22 which is shown as including the contact relay 24 which is in series with resistor 26. The relay 24 also has coupled across it capacitor 28. It is also noted that the like components including the relay 24, resistor 26 and capacitor 28 are illustrated in FIG. 2. FIG. 1 also shows the transistor Q2 which is described with associated circuitry in more detail in FIG. 2.

The circuitry of FIG. 2 including transistors Q1 and Q2 has an improved drive start-up feature. In this regard the relay 24 controls the contact 16 so that when AC power is applied at lines X1, X2 and X3, contact 16 is open leaving the resistor 14 in the circuit until a predetermined voltage is sensed by the relay 24 at which time the contact 16 closes shorting the resistor 14. Capacitor 28 provides a delay time on contact 16 closing. Thus, at drive start-up the temporary inclusion of the resistor 14 assures that excess currents will not be drawn.

FIG. 1 also shows the motor drive transistors T1-T6. These are power transistors and although illustrated in FIG. 1 as each being of single transistor construction, it is preferred that they are each a Darlington pair as illustrated and discussed in more detail hereinafter in FIG. 3. These transistors are provided in pairs including T1 and T4, T2 and T5, T3 and T6. The junction of these pairs couples to contactor terminals 32. The contactor terminals in turn couple to the output motor terminals 34 illustrated as terminals M1, M2 and M3.

FIG. 1 also illustrates input control terminals C1-C6 associated respectively with the transistors T1-T6. These control terminals are at the base of each of the transistors. The signals applied to these terminals are at the proper timed intervals so as to provide a standard motor drive. For example, with regard to transistors T1 and T4 during one-half of the cycle transistor T1 is on and transistor T4 off and during the other portion of the cycle transistor T1 is off and transistor T4 is on. The control signals at the input control terminals C1 and C4 control the conductivity of their respective transistors.

In FIG. 2, as mentioned previously, many of the components are duplicated in FIG. 1 and were discussed previously. Thus, in FIG. 2 there are shown the lines X1, X2 and X3 along with lines X4 and X5. The lines X1, X2 and X3 couple to suppressors 36 which are used for suppressing an over voltage condition. The lines X1, X2 and X3 also couple to resistors R1, R2 and R3 respectively. The input of these resistors taken at line 37 is normally at a voltage of about 30 volts with respect to line X4. The signal from line 37 couples to capacitor C1 and resistor R4. This signal couples by way of resistor R4 to the base of transistor Q1. Associated with transistor Q1 is an emitter resistor R6 and associated with the collector of transistor Q1 is a light emitting diode 39 in series with resistor R9.

The circuit of FIG. 2 also includes a second transistor Q2 connected from the transistor Q1. The base of transistor Q2 couples from the collector of transistor Q1. A capacitor C3 is connected between the emitter and collector electrodes of transistor Q2. The two emitters of transistors Q1 and Q2 are connected in common. The collector of transistor Q2 couples to the series resistors R10 and R11. The collector of transistor Q2 also couples to resistors R7 and R8. FIG. 2 shows terminals 41 which may connect to a control regulator board. Finally, the collector of transistor Q2 couples to the aforementioned circuit including resistor 26 and relay 24.

When power is applied at the input terminals X1, X2 and X3, capacitor C1 is charged sufficiently over a predetermined charge period so as to cause transistor Q1 to conduct. This action clamps transistor Q2 off, out of conduction, and current can then flow by way of resistors R10 and R11 to resistor 26 and associated relay 24. The relay 24 then operates to close the contact 16 in the manner previously described. If there is an absence of power at the input terminals, then the transistor Q1 is non-conductive and the transistor Q2 conducts essentially clamping the relay 24 to its de-energized condition. The capacitor 28 across relay 24 provides some time delay for this action. Clamping the relay in this manner re-establishes resistor 14 into the charge path if a momentary interruption of power occurs at the AC input 9.

Figure 3:
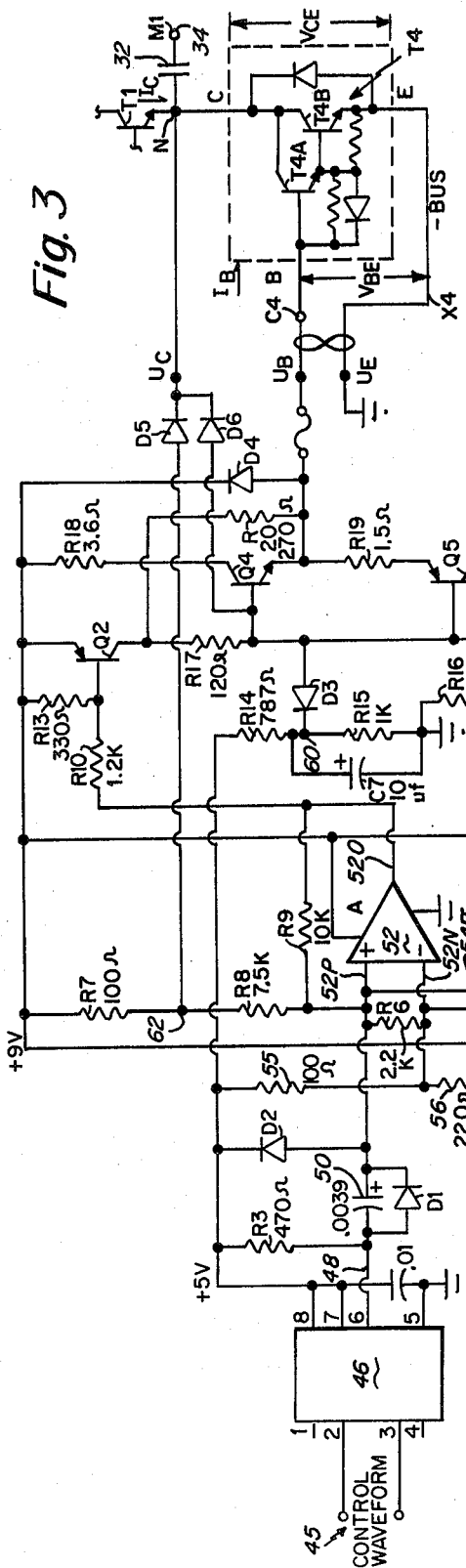
FIG. 3 is a circuit diagram of the base drive circuit of this invention illustrating the drive for one of the power transistors previously shown in FIG. 1.

In accordance with the invention reference is now made to FIG. 3 and the detailed circuit diagram of the base drive circuit. FIG. 3 shows the power transistor means which is illustrated in the diagram as Darlington transistor pair T4 corresponding to the transistor T4 illustrated in FIG. 1. This Darlington pair includes transistors T4A and T4B. It is understood that there are a plurality of such base drive circuits each associated with a power transistor means. However, for the sake of simplicity only one of these base drive circuits is shown in FIG. 3 all others being of identical construction.

It is noted that the circuit illustrated in FIG. 3 has its output coupled to the control terminal C4 which couples to the transistor T4. The collector of the transistor couples to a common node N which couples by the contactor 32 to the motor terminal 34 also identified as terminal M1. These are the same designations previously described in FIG. 1. In addition to the common terminal N the transistor also is coupled to a negative bus which is the line X4, which also intercouples to other ones of the transistors as shown in the more complete overall inverter diagram of FIG. 1.

Part of FIG. 3 illustrates a power supply 40. This power supply may be of conventional design and in the embodiment described is shown coupling from an AC source 43. The AC source 43 couples to a diode bridge 42. The power supply circuit also includes a regulator 44 which is a readily available commercial regulator. The power supply provides typical low DC voltages such as +5 volts, +9 volts and −9 volts. These voltages are shown coupling to the base drive circuitry.

FIG. 3 illustrates an input control waveform at terminals 45. This control waveform can take on many forms and is generally a cyclic waveform. One form of control signal that has been used is a pulse width modulation signal. This input signal at terminals 45 couples to an opto-isolator 46 which includes a light emitting diode and associated photosensing device. The output from the isolator 46 is at line 48 and couples to the capacitor 50. The control waveform at terminals 45 is adapted to cause the line 48 to pull to ground potential to initiate the switching action of the base drive circuit for switching the power transistor. This transition signal to ground is coupled by way of the capacitor 50 to the comparators 52 and 54. This signal couples in common to the two positive inputs 52P and 54P of the respective comparators 52 and 54. A resistor network including resistors 55 and 56 provides a fixed bias to the negative inputs 52N and 54N of the respective comparators 52 and 54.

When the input signal at line 48 transistions to ground, this pulls the inputs 52P and 54P below the reference inputs 52N and 54N causing the output 52O to go to ground and causing the output 54O to go to a negative voltage of on the order of −9 volts. When this action commences, a negative going voltage and the output of comparator 52 causes transistor Q2 to conduct. Similarly, the negative voltage at the output of comparator 54 causes transistor Q3 to cease conduction. When the transistor Q2 conducts, most of the collector current of the transistor flows through resistor R17 into the base of transistor Q4. This causes transistor Q4 to likewise conduct and saturate delivering a maximum base current to the control terminal C4 and the power transistor T4. The maximum base current drive to the power transistor from transistor Q4 is limited by the selection of the ohmage of resistor R18.

During a normal conduction cycle the base-to-emitter voltage of transistor T4 is below the voltage at the node 60 between resistors R14 and R15 and diode D3 and capacitor C7. This assures that diode D3 is reverse biased and no current limiting occurs by way of that path. However, as the power transistor T4 becomes conductive, the collector-to-emitter voltage thereof approaches saturation causing diodes D5 and D6 to forward bias. The diode D5 in a sense operates as a latch by pulling the node 62 sufficiently low so that the divider of resistors R7 and R8 along with resistor R9 maintains the voltage at the inputs 52P and 54P below the voltage at the other comparator inputs 52N and 54N. This thus maintains the comparators 52 and 54 in a state wherein the base drive circuit is in its drive mode.

The other diode D6, when it forward biases, has the effect of reducing the base drive to transistor Q4. Diode D6 essentially diverts some of the drive current that would normally flow to the base of the drive transistor Q4. This prevents the power transistor from entering hard saturation and also enhances the turn-off characteristics of the circuit. Furthermore, the transistor will respond much more quickly to any overload or short circuit condition that may be applied after the transistor has become conductive. Thus, the time elapsed between the onset of an overload condition and the subsequent detection and control of such condition, as described below, is kept to a minimum.

Figure 4:
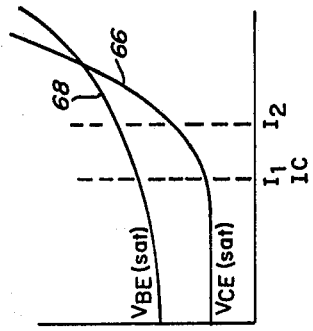
FIG. 4 is a graph associated with the power transistor and associated drive circuit.

Referring now to FIG. 4, there is shown a plot of voltage versus collector current with two curves being shown. Curve 66 shows the collector-to-emitter voltage while curve 68 shows the base-to-emitter voltage. In accordance with the present invention, both of these voltages are monitored for providing both maximum protection and maximum performance.

Further control is provided when the power transistor conducts into an overload or short circuit condition. Under this condition, the base-to-emitter voltage of the transistor increases as the collector current increases. Again, reference can be made to FIG. 4. FIG. 4 shows a first level of collector current I1 under which normal drive current control occurs. At current I2 this may be considered as the commencement of an overload or short circuit condition in which the base-to-emitter voltage increases to a point where the diode D3 forward biases thus further limiting the base drive to transistor Q4, and consequently the base drive to the power transistor. This has the effect of furthermore limiting the peak collector current that will be conducted by the transistor T4. When the diode D3 forward biases the capacitor C7 absorbs the base drive until the protection cycle is completed.

During an overload or short circuit condition, the capacitor 50 is charged by resistors R6, R8 and R9 until the inputs 52P and 54P finally become more positive than the other inputs 52N and 54N of the respective comparators 52 and 54. When this occurs, the outputs at the comparators turn off thus causing transistor Q2 to cease conduction and cause transistor Q3 to conduct. When transistor Q3 conducts, this in turn causes transistor Q5 to conduct to provide reverse base drive to the power transistor. The reverse current is limited by the resistor R19 which couples to the emitter of transistor Q5. Also, the zener diode Z1 reduces the reverse voltage applied to the power transistor to prevent avalanching of the base emitter diodes thereof. The base drive remains in the off state for the remainder of the conduction cycle commanded by an input at input terminals 45.

The conduction cycle terminates when the control signal commands the base drive to switch off. Under that condition, the output line 48 from the opto-isolator 46 ceases conduction. The capacitor 50 then discharges through diode D2 and resistor R6 thus holding the input lines 52P and 54P above the reference lines 52N and 54N of the respective comparators 52 and 54. Once the capacitor 50 is discharged, then diode D1 and resistor R3 maintain the positive inputs to the comparators above the negative inputs, thus holding the drive in its off state.

Having described one embodiment of the present invention, it should now be apparent to those skilled in the art that numerous other embodiments are contemplated as falling within the scope of this invention.

What is claimed is:

1. A circuit for driving a biased power transistor high voltages and that has an input electrode and a pair of output electrodes comprising emitter and collector electrodes, said circuit comprising;
   input circuit means for receiving an input control signal said power transistor,
   control transistor means coupled from said input circuit means having drive and non-drive states and having its output coupled to the input electrode of said power transistor,
   first means, responsive to the magnitude of the power transistor collector-to-emitter voltage exceeding a predetermined threshold, for decreasing drive current from the control transistor means to the power transistor,
   second means, responsive to the magnitude of the power transistor base-to-emitter voltage exceeding a predetermined threshold under overload conditions, for decreasing drive current from the control transistor means to the power transistor,
   and third means, responsive to the magnitude of the power transistor collector-to-emitter voltage being below a predetermined reference level, for decreasing drive current to the power transistor for maintaining the power transistor in a non-saturated condition.

2. A circuit as set forth in claim 1 wherein said first means includes a first unilateral means for conducting when the collector-to-emitter voltage exceeds said threshold.

3. A circuit as set forth in claim 2 wherein said second means includes a second unilateral means for conducting when the base-to-emitter voltage exceeds the threshold.

4. A circuit as set forth in claim 3 wherein said input circuit means comprises a comparator means and said control transistor means comprises at least one drive transistor.

5. A circuit as set forth in claim 4 wherein said first unilateral means couples to the base of said drive transistor to divert base drive from said transistor.

6. A circuit as set forth in claim 5 including means coupling the second unilateral means to the base of said drive transistor.

7. A circuit as set forth in claim 6 including a pair of comparators and a second transistor, said comparators coupling to respective first and second drive transistors.

8. A circuit as set forth in claim 7 wherein said first unilateral means couples to the power transistor collector and the second unilateral means couples to the power transistor base by way of the first drive transistor base-to-emitter junction.

9. A circuit as set forth in claim 8 including a third unilateral means coupled from the collector of the power transistor to the input of said comparators to hold the comparators latched.

10. A circuit as set forth in claim 9 wherein the first means is operative at a lower collector current than the second means.

11. A circuit as set forth in claim 1 wherein said first means comprises means responsive to the magnitude of the collector-to-emitter voltage exceeding a predetermined threshold for turning off and reverse biasing the power transistor after a fixed delay time.

* * * * *

UNITED STATES PATENT OFFICE
CERTIFICATE OF CORRECTION

Patent No. 4,427,902          Dated January 24, 1984

Inventor(s) Mark Hickman and Michael M. Brown

It is certified that error appears in the above-identified patent and that said Letters Patent are hereby corrected as shown below:

Column 6, line 31, after "transistor" insert -- for switching --.
Column 6, line 36, after "signal" insert -- for switching --.

Signed and Sealed this

Seventeenth Day of July 1984

[SEAL]

Attest:

GERALD J. MOSSINGHOFF

Attesting Officer      Commissioner of Patents and Trademarks